US005504338A

United States Patent [19]
Marrian et al.

[11] Patent Number: 5,504,338
[45] Date of Patent: Apr. 2, 1996

[54] APPARATUS AND METHOD USING LOW-VOLTAGE AND/OR LOW-CURRENT SCANNING PROBE LITHOGRAPHY

[75] Inventors: Christie R. K. Marrian, Marbury, Md.; Eric S. Snow, Springfield, Va.; Elizabeth A. Dobisz, Owings, Md.

[73] Assignee: The United States of America as represented by the Secretary of the Navy, Washington, D.C.

[21] Appl. No.: 83,578

[22] Filed: Jun. 30, 1993

[51] Int. Cl.[6] .................................................. H01J 37/26
[52] U.S. Cl. ........................ 250/492.2; 250/306; 250/307
[58] Field of Search .................................... 250/306, 307, 250/492.2, 492.3; 73/105; 365/151, 114, 126, 174

[56] References Cited

U.S. PATENT DOCUMENTS

| | | | |
|---|---|---|---|
| 3,670,404 | 6/1972 | Kamoshida | 250/492.2 |
| 4,109,029 | 8/1978 | Ozdemir et al. | 250/492.2 |
| 4,785,189 | 11/1988 | Wells | 250/492.2 |
| 4,968,390 | 11/1990 | Bard et al. | 204/15 |
| 4,983,830 | 1/1991 | Iwasaki et al. | 250/309 |
| 5,047,649 | 9/1991 | Hodgson et al. | 250/306 |
| 5,132,934 | 7/1992 | Quate et al. | 365/151 |
| 5,150,392 | 9/1992 | Hohn et al. | 250/306 |
| 5,223,687 | 6/1993 | Yuasa et al. | 219/68 |
| 5,253,516 | 10/1993 | Elings et al. | 73/104 |
| 5,260,567 | 11/1993 | Kuroda et al. | 250/306 |
| 5,267,471 | 12/1993 | Abraham et al. | 73/105 |
| 5,329,808 | 7/1994 | Elings et al. | 250/307 |

OTHER PUBLICATIONS

H. C. Day et al., Selective Area Oxidation of Silicon with a Scanning Force Microscope, Applied Physics Letters, May 24, 1993 vol. 62, No. 21, Tempe, Arizona.
A. Majumdar et al., Nanometer–Scale Lithography Using the Atomic Force Microscope, Applied Physics Letters, vol. 61, No. 19, Nov. 9, 1992, pp. 2293–2295, Tempe, Arizona.
Nanofabrication Techniques, Abstract Submitted for the 1993 March Meeting of the American Physical Society, Mar. 22–26, 1993.

*Primary Examiner*—Jack I. Berman
*Assistant Examiner*—Kiet T. Nguyen
*Attorney, Agent, or Firm*—Thomas E. McDonnell; Daniel Kalish

[57] ABSTRACT

An apparatus and method lithographically patterns an imaging layer using a predetermined pattern. The apparatus includes a cantilever having a tip attached thereto, which tip includes a conductive or semiconductive material. The apparatus also includes a scanning probe controller connected to the cantilever, which maintains the tip in contact with the imaging layer to be patterned. Substantially while the scanning probe controller maintains the tip in contact with the imaging layer, a voltage and/or current generator coupled to the tip selectively generates a voltage and/or current between the tip and the imaging layer to affect a physical change in the imaging layer based on the predetermined pattern. The physical change in the imaging layer can be exploited to fabricate integrated circuits, lithographic masks or micromechanical devices, for example. The scanning probe controller can also measure the topographical change in the imaging layer caused by the physical change using the same cantilever and tip.

20 Claims, 3 Drawing Sheets

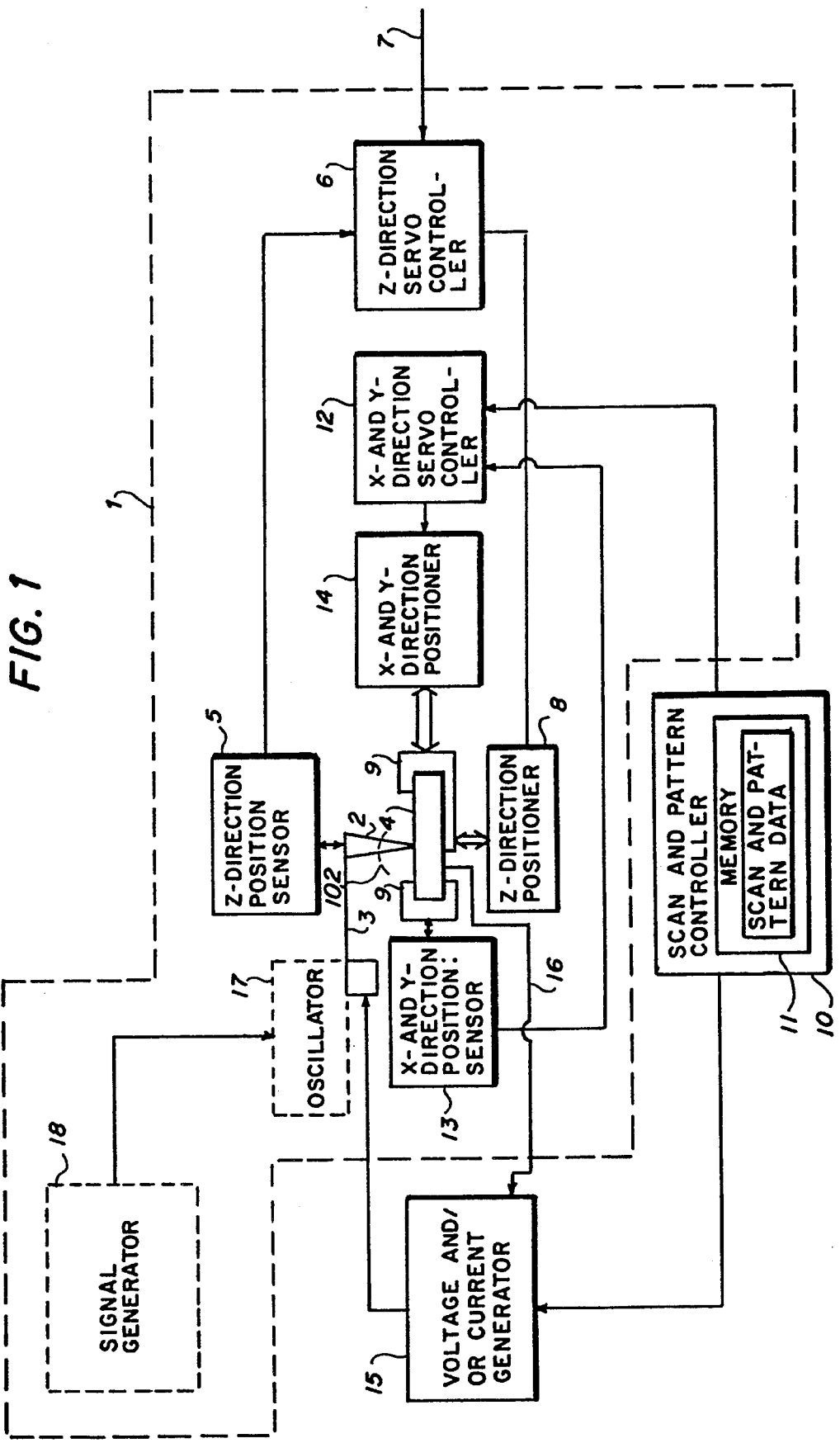

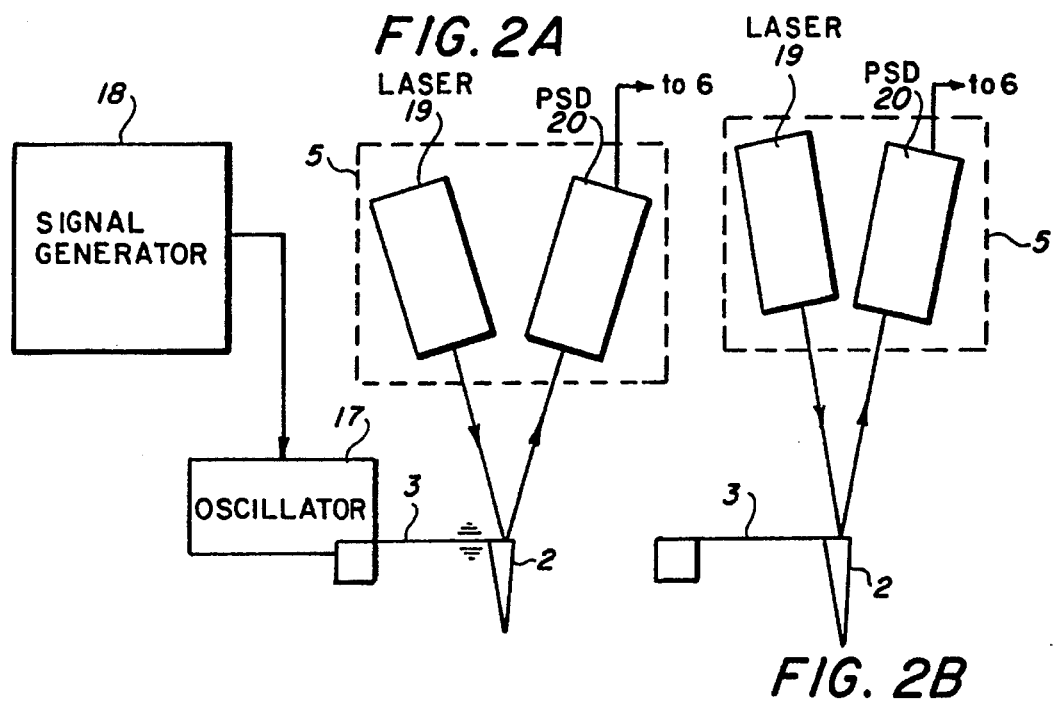
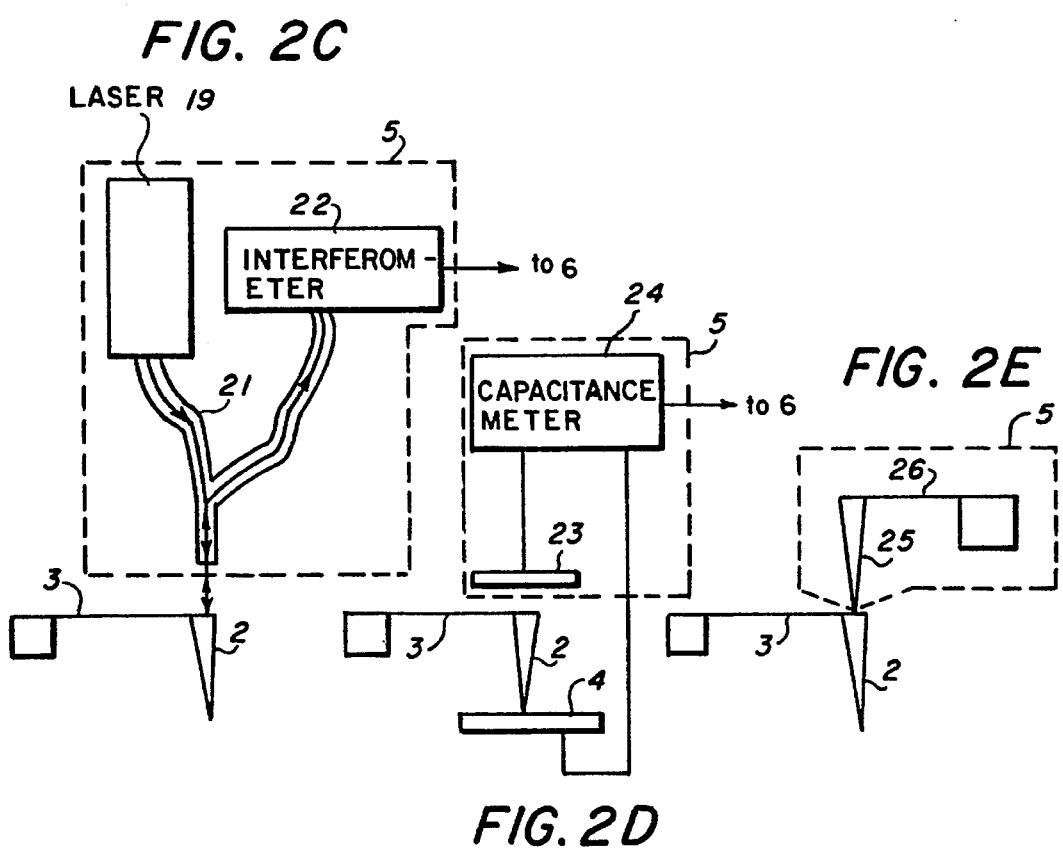

APPARATUS AND METHOD USING LOW-VOLTAGE AND/OR LOW-CURRENT SCANNING PROBE LITHOGRAPHY

BACKGROUND OF THE INVENTION

1. Field of the Invention

This invention is directed to an apparatus and method using low-voltage and/or low-current scanning probe lithography and, more particularly, to an apparatus and method for performing low-voltage and/or low-current scanning probe lithography using a sharp tip or probe attached to a cantilever to maintain contact with an imaging layer to be lithographed.

2. Description of the Related Art

Microelectronic and micromechanical fabrication technology continues to move toward smaller feature sizes (and hence, higher lithography resolution) for integrated circuits, lithographic masks or micromechanical components. At present, focussed beam lithography is used to achieve the highest lithographic resolution by direct patterning on a substrate, or by patterning a mask to be used for lithography in conjunction with optical, ultraviolet or x-ray radiation. However, as discussed below, there are limits to focussed beam lithographic resolution as currently practiced.

The common approach to achieving smaller lithographic resolution uses focussed beam lithography with high electron or ion beam energies, to obtain a more tightly focussed spot in which the beam is projected onto a mask surface or substrate. To form a pattern on a mask or chip using such conventional focussed beam lithographic devices or techniques, a suitable substrate or mask is first covered with a thin layer of radiation sensitive material (i.e., a resist). The electron or ion beam exposes (i.e., induces a physical change in) the resist and the exposed resist pattern can be developed using a suitable solvent.

For feature sizes less than 100 nanometers, lithographic resolution is limited not by the focus of the beam but by electron or ion beam scattering in the resist and from the substrate. This scattering causes reduced lithographic resolution and pattern distortions commonly referred to as "proximity effects". Although progress has been made over the last twenty years in reducing these effects, such effects are an inherent manifestation of the interaction of the high-energy electrons or ions used in a beam with solid matter, such as a substrate or mask surface. Thus, despite the use of beams with energies as high as 100 kilo-electron volts (keV), scattering (although more diffuse) still occurs and limits the lithographic resolution of the resist. These proximity effects are particularly acute with resists which have sensitivities which could be expected to be used to obtain practical throughput levels for integrated circuits, lithographic masks or micromechanical devices, for example.

A different approach to achieve higher lithographic resolution is to reduce the energy of the electron or ion beam used for beam lithography. One conventional device employing this technique uses a scanning tunneling microscope (STM) which uses field emission of electrons from an electrode tip. From the electrode tip, the electrons travel through a resist to a substrate, to expose the resist. This conventional STM suffers from the disadvantage that the current flowing from the tip of the electrode to the substrate via the resist, is used both to expose the resist and to control the separation between the electrode and the substrate. By coupling these functions, the conventional STM is operationally limited. Specifically, the operation of the conventional STM with less than 15 volts between the electrode and the substrate is difficult because the control servo system pushes the electrode too close to the sample and into the resist. As a result, the tip can penetrate the resist and only the resist volume beneath the electrode is exposed and utilized. Also, this feature of the conventional STM places conditions upon the environment in which lithography can be performed. At 15 volts between the electrode and the substrate, vacuum conditions are required to prevent interaction between ambient gases and the substrate due to the electrons emitted between the electrode and the substrate. Because the typical energy needed to affect a modification in a resist is only on the order of 1 electron-volt, it would be desirable to provide operation at less than 15 volts to provide lithographic capability in ambient conditions or under an inert atmosphere such as argon or an inert liquid such as an oil or paraffin. Such operation would eliminate the need for expensive equipment to provide high-vacuum conditions as required with conventional STM devices as well as with high-energy beam lithography.

Another technology related to the present invention is scanning (or atomic) force microscopy ("SFM" or "AFM"). Scanning force micropsy has been used to map the surface topography of a sample by dragging an insulator tip over the sample. AFMs have also been used to image the surface of a sample for registration and alignment purposes. The insulator tip position is controlled by maintaining a constant force of the tip on the sample, and the deflection of a cantilever to which the insulator tip is attached is monitored to map the surface topography of the sample.

SUMMARY OF THE INVENTION

An object of the present invention is to provide an apparatus, system and method for patterning small feature sizes in integrated circuits or micromechanical components or lithographic masks.

Another object of the present invention is to provide an apparatus, system and method for patterning small feature sizes in integrated circuits or micromechanical components or lithographic masks using a resist in which the exposure of the resist can be controlled independently of the tip position.

A further object of the present invention is to provide an apparatus, system and method for high-resolution lithography in which the relative position of a conductive or semiconductive tip on a cantilever with respect to a surface of an imaging layer need not be monitored by any physical change in the imaging layer caused by the conductive or semiconductive tip.

Another object of the present invention is to provide an apparatus, system and method for high-resolution lithography in which the relative position of a conductive or semiconductive tip on a cantilever with respect to a surface of an imaging layer need not be monitored before affecting a physical change in the imaging layer using the conductive or semiconductive tip.

A further object of the present invention is to provide an apparatus, system and method for achieving high-resolution lithography in less time than prior art devices or techniques.

These objects are obtained by the apparatus and method herein disclosed. According to the present invention, an apparatus for lithographically patterning an imaging layer using a predetermined pattern, includes a cantilever which has a conductive or semiconductive tip attached thereto. The tip is extremely sharp so that it can be used to perform high resolution lithography on the imaging layer. A scanning probe controller is connected to the cantilever and maintains the tip in contact with a surface of the imaging layer. A voltage and/or current generator is coupled to the tip, and selectively generates a voltage and/or current between the conductive or semiconductive tip and the imaging layer to affect a physical change in the imaging layer based on the predetermined pattern. The voltage and/or current generator generates the voltage and/or current between the tip and the imaging layer, while substantially simultaneously, the scanning probe controller maintains the tip in contact with the surface of the imaging layer. Advantageously, this eliminates the need to withdraw the tip from the surface of the imaging layer, and therefore, also eliminates the need for additional equipment used in conventional devices to measure a gap between the tip and the surface. A scan and pattern controller coupled to the scanning probe controller and the voltage and/or current generator, stores scan data in association with pattern data. The scan and pattern controller outputs scan data to move the surface relative to the tip in x- and y-directions in a plane of the surface of the imaging layer. Substantially simultaneously with the output of the scan data, the scan and pattern controller outputs pattern data to control the voltage and/or current generator to selectively generate the voltage and/or current based on the pattern data defining the predetermined pattern.

These together with other objects and advantages, which will become subsequently apparent, reside in the details of construction and operation as more full described and claimed hereinafter, reference being had to the accompanying drawings, forming a part hereof, wherein like numerals refer to like parts throughout.

BRIEF DESCRIPTION OF THE DRAWINGS

FIG. 1 is a diagram of an apparatus in accordance with the present invention;

FIG. 2A is a diagram of a first implementation of a z-direction position sensor in accordance with the present invention;

FIG. 2B is a diagram of a second implementation of a z-direction position sensor in accordance with the present invention;

FIG. 2C is a third implementation of a z-direction position sensor in accordance with the present invention;

FIG. 2D is a fourth implementation of a z-direction position sensor in accordance with the present invention;

FIG. 2E is a fifth implementation of a z-direction position sensor in accordance with the present invention.

DETAILED DESCRIPTION OF THE PREFERRED EMBODIMENTS

Figure 3:
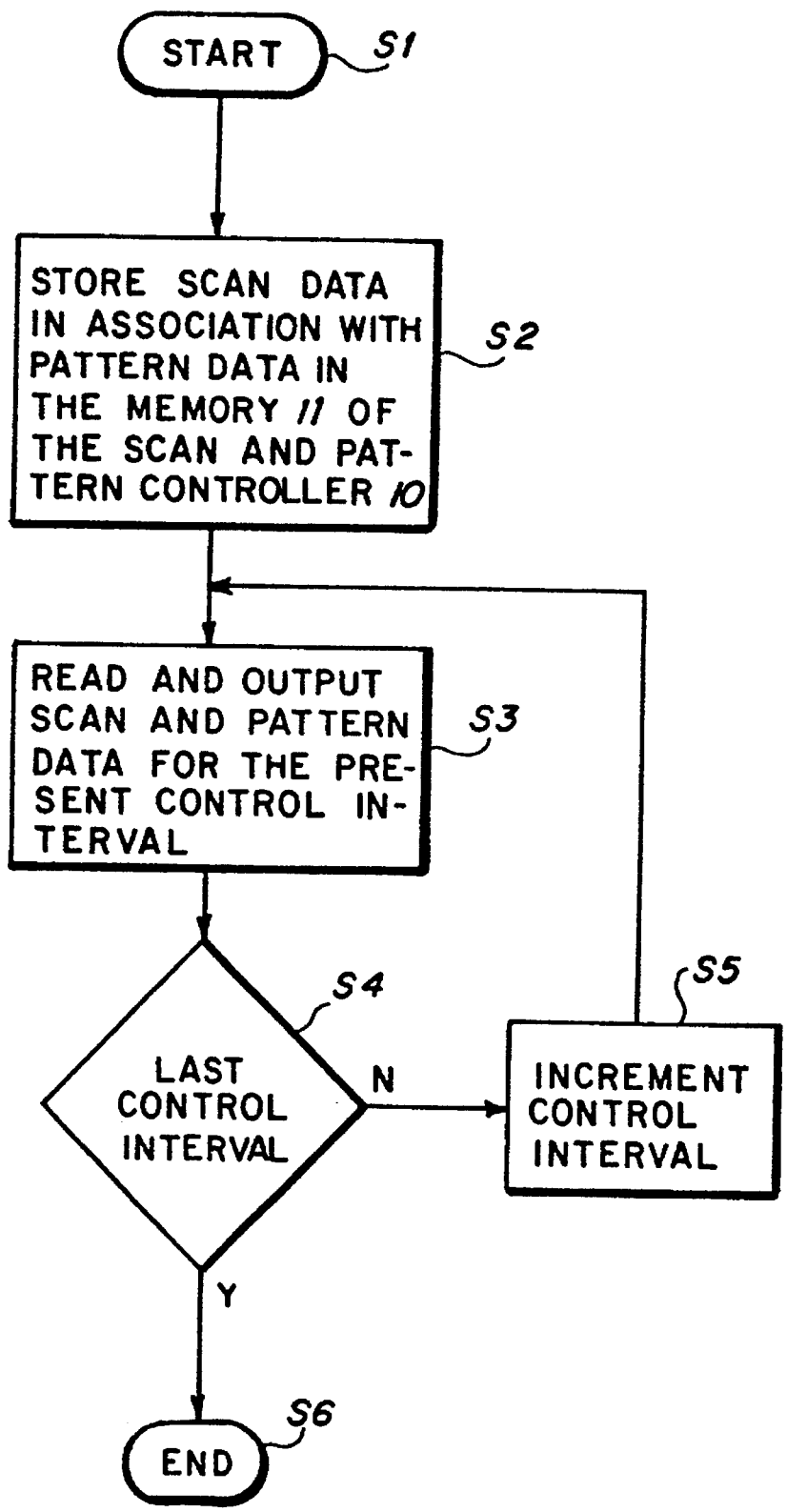
FIG. 3 is a flow chart of processing implemented by a microprocessor of a scan and pattern controller in accordance with the present invention.

FIG. 1 is a diagram of an apparatus in accordance with the present invention. In FIG. 1, a scanning probe controller 1 serves to maintain a tip 2 attached to a cantilever 3, in contact with a surface of an imaging layer 4. With the exclusion of the tip 2 and the cantilever 3, the scanning probe controller 1 can be implemented with a Park Scientific Instrument BD2-210 Scanning Force Microscope coupled to a Queensgate Instruments, Ltd. S-220 x-y stage. Although the tip 2 and the cantilever 3 used in the present invention are not standard items, they can be produced from conventional elements and techniques as described herein in a later paragraph.

The imaging layer 4 can be one of a variety of different types of layers. For example, the imaging layer 4 can be a surface of a conductor or semiconductor substrate or lithographic mask, upon which an electrochemical change can be affected to perform lithography. Also, the imaging layer 4 can be a resist formed on a conductor or a semiconductor substrate or a lithographic mask. Further, the imaging layer 4 can be a resist formed on a thin metal film deposited or formed on an insulator substrate.

Because the tip 2 is extremely sharp having a point 102 with radius of curvature typically on the order of tens of nanometers, and because the cantilever 3 is extremely sensitive, deflection of the cantilever 3 can be used to determine a topography of the imaging layer 4 with high precision. In addition, because the tip 2 and the cantilever 3 are conductive or semiconductive, a voltage and/or current can be passed through the cantilever 3 and the tip 2 to cause a physical change in the imaging layer 4, which physical change can be exploited to perform high-resolution lithography, as the scanning probe controller 1 maintains the tip 2 in contact with the imaging layer 4 with a constant force (i.e., a constant deflection of the cantilever 3). The physical change caused by the voltage and/or current occurs at and near the position where the tip is in contact.

More specifically, in the scanning probe controller 1, a deflection of the cantilever 3 along a z-direction perpendicular to the imaging layer 4, is detected with a z-direction position sensor 5 which outputs a detected signal based on the deflection of the cantilever 3. The detected signal is provided to a z-direction servo controller 6 which compares the detected signal with a predetermined deflection value received on line 7, to generate a result signal. The result signal is provided to z-direction positioner 8. The z-direction positioner 8 is electromechanically coupled to a stage 9 which fixedly holds the imaging layer 4. Based on the result signal, the z-direction positioner 8 moves the imaging layer 4 along a z-direction perpendicular to the imaging layer 4 and parallel to an axis of the tip 2. Thus, the z-direction position sensor 5, the z-direction servo controller 6 and the z-direction positioner 8 form a servo loop which maintains the tip 2 in contact with the imaging layer 4 by maintaining a constant deflection of the cantilever 3 based on the predetermined deflection value from line 7. In other words, the z-direction position sensor 5, the z-direction servo controller 6 and the z-direction positioner 8 maintain a constant force between the tip 2 and the imaging layer 4 as the tip 2 is scanned across the imaging layer 4 by moving the imaging layer 4 in a z-direction, relative to the tip 2 to adjust for the topography of the imaging layer 4.

Scanning of the tip 2 across the imaging layer 4, is directed by scan and pattern controller 10. The scan and pattern controller 10 includes a memory 11 which stores scan data which indicates a position or sequence of positions of the tip 2 in x- and y-directions in a plane of the imaging layer 4. The scan data is output to x- and y-direction servo controller 12 which receives a detected signal from x- and y-direction position sensor 13, indicating the present position of the tip 2 relative to the x- and y-directions. The x- and y-direction servo controller 12 compares the detected signal with the scan data, and outputs a result signal based on this comparison. The result signal is output to an x- and y-direction positioner 14 which is electromechanically coupled to the stage 9. Based on the result signal, the x- and y-direction positioner 14 moves the stage 9 in x- and y-directions to control a position of the tip 2 relative to the imaging layer 4 in the x- and y-directions.

The scan and pattern controller 10 also stores pattern data in association with the scan data. In conjunction with the output of scan data, pattern data associated with the scan data is output from the scan and pattern controller 10 to a voltage and/or current generator 15 coupled to the scan and pattern controller 10. The voltage and/or current generator 15 can be realized as a conventional voltage and/or current source, such as a Wavetek model 116.

Based on the pattern data, the voltage and/or current generator 15 is either activated or deactivated. When activated, the voltage and/or current generator 15 generates a voltage and/or current which is applied in a closed circuit including a conductive line from the current generator 15 to the cantilever 3 itself, the tip 2, the imaging layer 4 and line 16 which is connected to the voltage and/or current generator 15. The voltage and/or current applied between the tip 2 and the imaging layer 4 affects a change in the imaging layer 4, and is returned to the voltage and/or current generator 15 via line 16. The voltage and/or current can be either A.C. or D.C. with sufficient magnitude to affect the physical change in the imaging layer 4. When deactivated, the voltage and/or current generator 15 controls the voltage and/or current so that the voltage and/or current assumes a low or zero value which will not effect a change in the imaging layer 4.

Because the voltage and/or current must pass through the cantilever 3 and the tip 2, the cantilever 3 and the tip 2 are formed to be conductive or semiconductive, for example, by depositing a conductive or semiconductive material on the cantilever 3 and the tip 2. For example, a conductive material such as titanium, gold or chromium can be sputtered onto a conventional SFM insulator cantilever and tip or doped therein, to form the cantilever 3 and tip 2 of the present invention. Alternatively, the tip 2 and the cantilever 3 can be formed of a conductive or semiconductive material with an insulator formed thereon. For example, titanium can be used to form the tip 2 and the cantilever 3. A non-conductive oxide normally forms on titanium with exposure to oxygen, so that the resulting tip 2 and the cantilever 3 are largely conductive, but have an insulator coating formed by the non-conductive oxide.

Preferably, an oscillator 17 is coupled to the cantilever 3 at an end opposite to the end of the cantilever 3 at which the tip 2 is attached. The oscillator 17 can be realized using a piezoelectric crystal or a micro-electromechanical machine (MEM). A signal generator 18 is coupled to the oscillator 17, and generates a signal of about 10 to 100 kilohertz. The signal generator 18 can be implemented as a conventional timer. Based on this signal, the oscillator 17 oscillates and causes the cantilever 3 to vibrate. If the oscillator 17 and the signal generator 18 are used to vibrate the cantilever 3, the deflection detected by the z-direction position sensor 5 is an average value of the deflection of the cantilever 3. Therefore, the predetermined deflection value received on line 7 indicates a target average deflection value for the servo loop defined by the z-direction position sensor 5, the z-direction servo controller 6 and the z-direction positioner 8. The oscillator 17 and the signal generator 18 serve to increase the signal-to-noise ratio associated with detecting the deflection with the z-direction position sensor 5. Although the oscillator 17 and the signal generator 18 are preferred elements in the embodiment of FIG. 1, the oscillator 17 and the signal generator 18 are illustrated with a broken line to indicate that these elements are optional features of the embodiment of FIG. 1.

In operating the apparatus of FIG. 1, the stage 9 is removed from the vicinity of the tip 2 and a substrate including the imaging layer 4 is secured in the stage 9. By securing the substrate in the stage 9, the line 16 is connected to the current generator 15. If the substrate is an insulator with a conductive film formed thereon, a contact area on the conductive film is provided to connect the line 16.

Next, the scan and pattern controller 10 outputs scan data to position the tip 2 over the imaging layer 4 at an initial x- and y-position in the plane of the imaging layer 4. The tip 2 is then carefully lowered to contact with the imaging layer 4. As the tip 2 makes contact with the imaging layer 4, the cantilever 3 is deflected and the servo loop defined by the z-direction position sensor 5, the z-direction controller 6 and the z-direction positioner 8, maintain the deflection of the cantilever 3 at a predetermined deflection value input on line 7.

In a patterning mode of operation, while the tip 2 is maintained in contact with the imaging layer 4 using the servo loop defined by the z-direction position sensor 5, the z-direction servo controller 6 and the z-direction positioner 8, the scan and pattern controller 10 outputs scan and pattern data. The scan data drives the servo loop defined by the x- and y-direction servo controller 12, the x- and y-direction positioner 14 and the x- and y-direction position sensor 13, so that the tip 2 is scanned in x-and y-directions across the imaging layer 4. Substantially simultaneously with the output of scan data, the scan and pattern controller 10 outputs pattern data associated with the scan data, from the memory 11. The pattern data is output to the voltage and/or current generator 15 which is activated or deactivated based on the pattern data. If activated, the voltage and/or current generator 15 affects a physical change in the imaging layer 4, and if deactivated, the voltage and/or current generator 15 does not physically change in the imaging layer 4. The activation and deactivation of the voltage and/or current generator 15 as the tip 2 is scanned across the imaging layer 4, generates a pattern which can be exploited to fabricate integrated circuits, lithographic masks or micromechanical devices, for example.

The patterning mode of operation can be interrupted to analyze the physical change in the imaging layer 4. This mode of operation is an imaging mode in which the scanning probe controller 1 is operated as a conventional SFM to image the imaging layer 4 by scanning or traversing the tip across the imaging layer 4. For example, it is believed that certain types of resists shrink upon exposure. Therefore, in the imaging mode, the scanning probe controller 1 can be used to image the extent of exposure by analyzing shrinkage, so that patterning of the imaging layer 4 can be modified or altered if necessary. The capability to switch between the patterning and imaging modes of operation in situ is a marked improvement over conventional devices and techniques because the dual use of imaging and patterning modes of operation can avoid the need to develop resists for further examination to determine whether the patterning was performed correctly.

Preferably, the scanning probe controller 1 is provided with the oscillator 17 and the signal generator 18. If the scanning probe controller 1 is provided with the oscillator 17 and the signal generator 18, the signal generator 18 outputs the signal to the oscillator 17 to cause the cantilever 3 to vibrate. Then, the tip 2 is carefully brought into contact with the imaging layer 4 at the initial x- and y-position and the patterning mode of operation proceeds as described above.

In addition to conventional lithographic techniques, the apparatus of FIG. 1 is expected to be useful for many novel applications. For example, the low-voltage and/or low-current between the tip 2 and the imaging layer 4 can be used to perform lithography in ambient conditions because electrochemical reactions between the imaging layer 4 and ambient gases is reduced at low voltage and/or current levels, therefore eliminating the need for expensive equipment to control the environment in which lithography is performed and even eliminating the need for a resist (for example, the tip 2 can be used to affect an electrochemical change in a passivated surface which can be used to perform lithography without a resist). Also, the apparatus of FIG. 1 can be used to perform lithography in an electrochemical cell. The electrochemical cell could contain an inert oil or paraffin to provide electrical isolation so that lithography could be performed at ambient pressures. Also, lithography could be performed in an electrochemical cell directly onto the imaging layer 4 of a substrate without requiring a resist. Further, the liquid in the electrochemical cell could be changed to perform resist development and post-exposure processing in situ.

FIG. 2A is a more detailed diagram of the tip 2, the cantilever 3, the z-direction position sensor 5, the oscillator 17 and the signal generator 18. The z-direction position sensor 5 includes a laser 19 and a position sensitive detector ("PSD") 20. The laser 19 generates a laser light which is directed to a surface of the cantilever 3 near to where the tip 2 is attached to the cantilever 3. The laser light is reflected from the surface of the cantilever 3 and received by the PSD 20. As the tip 2 is deflected upon scanning the tip 2 across the imaging layer 4, the position at which the reflected laser light is incident to the PSD 20 changes. Therefore, the PSD 20 outputs the detected signal which is a measure of the position at which the reflected laser light reaches the PSD 20, which position is proportional to the deflection of the cantilever 3. Incidently, the cantilever 3, the laser 19 and the PSD 20 are conventionally known as an optical lever.

FIG. 2B is a second possible implementation of the z-direction position sensor 5. In FIG. 2B, the laser 19, the cantilever 3 and the PSD 20 are used as an optical lever as explained above with respect to FIG. 2A. However, in FIG. 2B, the oscillator 17 and the signal generator 18 are not used.

FIG. 2C is a third possible implementation of the z-direction position sensor 5. In FIG. 2C, the laser 19 generates laser light which is provided to optical fiber 21. The laser light travels from the optical fiber 21 to the surface of the cantilever 3. The laser light also reflects from the end of the optical fiber 21 to generate an interference pattern with the light reflected from the surface of the cantilever 3. This interference pattern is provided to interferometer 22 via a y-junction in the optical fiber 21. The interferometer 22 can be a conventional device and generates and outputs the detected signal to the z-direction servo controller 6.

FIG. 2D illustrates a fourth implementation of the z-direction position sensor 5. A capacitance plate 23 is arranged to oppose the surface of the cantilever 3, so that the deflection of the cantilever 3 can be sensed by detecting the capacitance between the capacitance plate 23 and the surface of the cantilever 3. A capacitance meter 24 measures the capacitance between the capacitance plate 23 and the surface of the cantilever 3, to generate the detected signal which is provided to the z-direction servo controller 6. The capacitance meter 24 can be of any conventional variety sufficiently sensitive to measure capacitance in the picofarad range or less.

FIG. 2E is a diagram of a fifth implementation of the z-direction position sensor 5. In FIG. 2E, the z-direction position sensor 5 is implemented as an SFM which generates the detected signal which is provided to the z-direction servo controller 6.

The scan and pattern controller 10 can be implemented in a variety of ways. For one, the scan and pattern controller 10 can be implemented as a counter (not shown in FIG. 1) which generates an address for the memory 11 to output the scan and pattern data. Alternatively, the scan and pattern controller 10 can be implemented as a microprocessor (not shown in FIG. 1) coupled to the memory 11. If the scan and pattern controller 10 is implemented using the microprocessor coupled to the memory 11, the microprocessor performs processing as shown in FIG. 3.

In FIG. 3, processing starts at step S1. At step S2, the microprocessor stores scan data in association with pattern data in the memory 11 of the scan and pattern controller 10. In step S3, the scan and pattern controller 10 reads and outputs scan and pattern data for the present control interval. In step S4, a decision is made to determine whether the present control interval is the last control interval to complete a scan. If not, in step S5, the control interval is incremented and control returns to step S3. On the other hand, in step S4, if the present interval is the last control interval, processing is terminated in step S6.

The many features and advantages of the present invention are apparent from the detailed specification and thus, it is intended by the appended claims to cover all such features and advantages of the invention which follow in the true spirit and scope thereof. Further, since numerous modifications and changes will readily occur to those skilled in the art, it is not desired to the limit the invention to the exact construction and operation illustrated and described. Accordingly, all suitable modifications and equivalents may be resorted to as falling within the scope and spirit of the invention.

What is claimed is:

1. A method comprising the steps of:
   (a) selectively generating at least one of a voltage and current between a tip and an imaging layer based on a predetermined pattern, the tip having at least one of conductive and semiconductive materials and being attached to a cantilever; and
   (b) substantially simultaneously with step (a), maintaining the tip in contact with the imaging layer, said maintaining step being unresponsive to the generated at least one of a voltage and current,
so as to selectively, lithographically and directly effect a physical modification of the imaging layer at and near the position where the tip is in contact.

2. A method as claimed in claim 1, further comprising the step of:
   (c) scanning, substantially simultaneously with steps (a) and (b), the tip in at least one of x- and y-directions in a plane defined by the imaging layer.

3. A method as claimed in claim 1, further comprising the step of:
   c) traversing the imaging layer with the tip to determine the effect of the at least one of the voltage and current on the imaging layer, after performing said steps (a)–(b).

4. A method for lithographically patterning a surface, comprising the steps of substantially simultaneously:
   a) detecting a deflection of a cantilever caused by a force between an imaging layer and a tip perpendicularly attached to the cantilever, the tip including at least one of conductive and semiconductive materials;
   b) maintaining the deflection at a predetermined value by moving the cantilever relative to the imaging layer along a z-direction parallel to an axis of the tip so as to maintain the tip in contact with the imaging layer;

c) scanning the tip in at least one of x- and y-directions in a plane defined by the imaging layer; and d) selectively generating at least one of a voltage and current between the tip and the imaging layer, based on a predetermined pattern, so as to selectively, lithographically and directly effect a physical modification of the imaging layer at and near the position where the tip is in contact, said maintaining step being unresponsive to the generated at least one of a voltage and current.

5. A method as claimed in claim 4, wherein the imaging layer is a substrate surface of a substrate.

6. A method as claimed in claim 5, further comprising the step of:

e) passivating the substrate surface before performing said steps (a)–(d).

7. The method of claim 4, further comprising the step of:

e) monitoring the physical change based on said step (d).

8. A method as claimed in claim 4, wherein the imaging layer is a resist surface of a resist formed on a substrate.

9. A method as claimed in claim 8, wherein the at least one of the voltage and current of said step (d) exposes the resist.

10. A method as claimed in claim 4, wherein said step (a) includes the steps of:

a1) vibrating a first end of the cantilever opposite a second end of the cantilever at which the tip is attached;

a2) irradiating a surface near the second end of the cantilever with a laser light, to generate a reflected light; and a3) detecting the reflected light with a position sensitive detector, wherein the deflection of said step (a) is an average detected value, and wherein the predetermined value of said step (b) is an average target value of the deflection.

11. A method as claimed in claim 4, wherein said step (a) includes the step of:

a1) detecting the deflection using an optical lever.

12. A method as claimed in claim 4, further comprising the step of:

e) traversing the imaging layer with the tip to determine the effect of the at least one of the voltage and current on the imaging layer, after performing said steps (a)–(d).

13. An apparatus for lithographically patterning an imaging layer using a predetermined pattern, comprising:

a cantilever having a tip including at least one of a conductive and semiconductive material;

one of a voltage and a current generator coupled to said tip, to selectively generate at least one of a voltage and current between said tip and the imaging layer; and a scanning probe controller connected to said cantilever for maintaining said tip in contact with the imaging layer while said generator selectively generates at least one of a voltage and current between said tip and the imaging layer, said scanning probe controller being unresponsive to the generated at least one of a voltage and current, so as to selectively, lithographically and directly effect a physical modification of the imaging layer at and near the position where the tip is in contact based on the predetermined pattern.

14. An apparatus as claimed in claim 13, further comprising a scan and pattern controller coupled to said scanning probe controller and to at least one of a voltage and current generator, to store scan data in association with pattern data defining the predetermined pattern, to output scan data to move the imaging layer relative to the tip in x- and y-directions in a plane of the imaging layer, and to output pattern data to control said one of a voltage and current generator to selectively generate at least one of a voltage and current based on the pattern data.

15. An apparatus as claimed in claim 13, wherein the imaging layer is a substrate surface of a passivated substrate.

16. An apparatus as claimed in claim 13, wherein the imaging layer is a resist surface of a resist formed on a substrate.

17. An apparatus for lithographically patterning an imaging layer using a predetermined pattern, comprising:

(a) a cantilever having a tip including at least one of a conductive and semiconductive material;

(b) one of a voltage and current generator coupled to said tip, to selectively generate at least one of a voltage and current between said tip and the imaging layer; and (c) a scanning probe controller connected to said cantilever for maintaining said tip in contact with the imaging layer while said generator selectively generates at least one of a voltage and current between said tip and the imaging layer, said scanning probe controller comprising a z-direction position sensor including an optical lever, said scanning probe controller being unresponsive to the generated at least one of a voltage and current, so as to selectively, lithographically and directly effect a physical modification of the imaging layer at and near the position where the tip is in contact based on the predetermined pattern.

18. The apparatus as claimed in claim 17, wherein said scanning probe controller comprises:

said sensor including said optical lever, arranged to detect a deflection of said cantilever and to generate a detected signal based on the deflection;

a z-direction servo controller coupled to said sensor, to compare the detected signal with a predetermined value to obtain an output signal; and a z-direction positioner coupled to said z-direction servo controller, to move the imaging layer relative to the tip along a z-direction perpendicular to the imaging layer, based on the output signal.

19. An apparatus as claimed in claim 17, wherein:

said cantilever comprises a first end opposite a second end of said cantilever to which said tip is attached; and said scanning probe controller comprises:

an oscillator to vibrate said first end of said cantilever based on a signal; and a signal generator coupled to said oscillator, to generate and output the signal to said oscillator.

20. An apparatus for lithographically patterning an imaging layer, comprising:

(a) one of an electrically conductive and semiconductive pointed tip having a contact area for being maintained in close contact with the imaging layer for carrying at least one of a voltage and current between the tip and the imaging layer and for being moved in a predetermined pattern, said contact area having a radius of curvature on the order of tens of nanometers; and (b) a controller coupled to said tip for maintaining said tip in close contact with the imaging layer, said controller operating by feedback and being unresponsive to the at least one of a voltage and current.

* * * * *